(12) United States Patent
Ueda et al.

(10) Patent No.: US 8,435,611 B2
(45) Date of Patent: May 7, 2013

(54) TRANSFER SHEET AND METHOD FOR FORMING THE SAME

(75) Inventors: Kenji Ueda, Kanagawa (JP); Yuichi Arisaka, Miyagi (JP)

(73) Assignee: Sony Corporation, Tokyo (JP)

( * ) Notice: Subject to any disclaimer, the term of this patent is extended or adjusted under 35 U.S.C. 154(b) by 732 days.

(21) Appl. No.: 12/509,122

(22) Filed: Jul. 24, 2009

(65) Prior Publication Data
US 2010/0028570 A1  Feb. 4, 2010

(30) Foreign Application Priority Data
Jul. 31, 2008  (JP) ................. 2008-197709

(51) Int. Cl.
*B41M 5/00*  (2006.01)
(52) U.S. Cl.
USPC ............ 428/32.6; 428/32.74; 428/457
(58) Field of Classification Search ......... 428/32.6, 428/32.74, 457
See application file for complete search history.

(56) References Cited

U.S. PATENT DOCUMENTS 7,132,140 B2   11/2006  Nguyen
2005/0233547 A1*  10/2005  Noda et al. ............... 438/459
2007/0290611 A1*  12/2007  Yamasaki et al. ......... 313/504
2008/0124647 A1   5/2008  Matsuda

FOREIGN PATENT DOCUMENTS

| JP | 2003-234185 | 8/2003 |
|---|---|---|
| JP | 2005-019955 | 1/2005 |
| JP | 2005-149834 | 6/2005 |
| JP | 2005-183381 | 7/2005 |
| JP | 2007-059229 | 3/2007 |
| JP | 2007173145 | 5/2007 |
| JP | 2008500730 | 1/2008 |

OTHER PUBLICATIONS

Japanese Office Action issued Oct. 12, 2010 for corresponding Japanese Appln. No. 2008-197709.
Japanese Office Action for corresponding JP2008-197709 issued on Jun. 9, 2010.
Japanese Office Action for corresponding JP2008-197709, issued on Apr. 13, 2010.

* cited by examiner

*Primary Examiner* — Betelhem Shewareged
(74) *Attorney, Agent, or Firm* — K&L Gates LLP

(57) ABSTRACT

A transfer sheet includes a supporting substrate, a photothermal conversion layer disposed on the supporting substrate, and a passive layer disposed on the photothermal conversion layer.

5 Claims, 3 Drawing Sheets

TRANSFER SHEET AND METHOD FOR FORMING THE SAME

CROSS REFERENCES TO RELATED APPLICATIONS

The present application claims priority to Japanese Priority Patent Application JP 2008-197709 filed in the Japan Patent Office on Jul. 31, 2008, the entire content of which is hereby incorporated by reference.

BACKGROUND

The present application relates to a transfer sheet and a method for forming the transfer sheet, and particularly to a transfer sheet used when a transfer layer composed of an organic material is transferred to the device substrate side.

Organic electroluminescence (EL) devices that use electroluminescence achieved with an organic material include an organic layer formed by stacking an organic hole transporting layer and an organic light-emitting layer between a lower electrode and an upper electrode. Such organic electroluminescence devices have received attention as light-emitting devices capable of emitting high-intensity light with a low voltage direct current drive.

In recent years, compared with a mask deposition method or an ink jet method, a transfer method that can use a large substrate and considerably reduce manufacturing time has received attention as a technique for patterning an organic layer in the manufacturing of a full-color display using the organic EL devices. In the transfer method, a transfer sheet including an organic layer to be transferred is used. For example, a transfer sheet used in a thermal transfer method includes an organic layer on a substrate through a photothermal conversion layer.

In such a transfer sheet, the surface of the photothermal conversion layer that is a base surface where an organic layer is disposed is preferably clean and moisture, oxygen, or the like that decomposes the organic layer should not be adsorbed on the surface.

The adsorption of moisture or oxygen on the base surface of the organic layer is prevented by forming a silicon nitride film on the photothermal conversion layer and then by disposing an organic layer on the silicon nitride film.

Alternatively, it is proposed that a second metal layer including a metal such as aluminum (Al) or barium (Ba) that reacts with moisture or oxygen be coated on a first metal layer that is a photothermal conversion layer, and an organic layer be coated on the second metal layer. In this case, the second metal layer composed of a metal that reacts with moisture or oxygen is deposited on the first metal layer (photothermal conversion layer) by vapor deposition shortly before the organic layer is coated (refer to Japanese Unexamined Patent Application Publication (Translation of PCT Application) No. 2008-500730, e.g., [0014]).

SUMMARY

However, even if any of the transfer sheets described above is used, the properties of the base surface below the organic layer are changed in accordance with the storage conditions before the organic layer is disposed. When the organic layer disposed on the base surface is transferred to the device substrate side, it is difficult to maintain the film properties of the organic layer.

For example, in Japanese Unexamined Patent Application Publication (Translation of PCT Application) No. 2008-500730, the second metal layer is deposited on the first metal layer (photothermal conversion layer) shortly before the organic layer is coated. In other words, the second metal layer is deposited on the first metal layer and the organic layer is then coated shortly thereafter. Therefore, in the case where the transfer sheet after the organic layer has been transferred is repeatedly used for recycling, the surface state of the second metal layer is changed after the transfer sheet on which the second metal layer is still formed is stored in the atmosphere. Furthermore, even if the transfer sheet including up to the second metal layer is stored in a glove box or a vacuum evaporator, the surface state changes in accordance with storage time. The change of the surface state of the second metal layer causes the characteristic change of the organic electroluminescence device obtained by forming the organic layer with this transfer sheet.

In the present application, it is desirable to provide a transfer sheet in which a transfer layer having stable film properties that are independent of the storage conditions in repetitive use can be transferred to the target device substrate and to provide a method for forming the transfer sheet.

A transfer sheet according to an embodiment includes a passive layer on a supporting substrate through a photothermal conversion layer. A transfer layer to be transferred composed of an organic material is disposed on the surface of the passive layer.

Such a transfer sheet is formed by forming a photothermal conversion layer on a supporting substrate and then forming a passive layer on the photothermal conversion layer. For example, the passive layer is formed by forming a metallic material layer on the photothermal conversion layer and then oxidizing the surface of the metallic material layer to passivate the surface. After the plasma cleaning is conducted on the surface of the passive layer, a transfer layer composed of an organic material is formed on the plasma-cleaned surface. The transfer layer is formed by, for example, vapor deposition.

According to the structure described above, since a passive layer that is invariably stable in terms of material properties is used as a base and a transfer layer is disposed thereon, the material properties of the transfer layer can be maintained without being affected by the base.

According to an embodiment, even when a transfer sheet including up to a passive layer is repeatedly used, a transfer layer can be disposed on the passive layer that is stable in terms of material properties, regardless of its storage conditions. As a result, even if the transfer layer is composed of an organic material, a transfer layer whose material properties can be maintained without being affected by a base can be transferred onto a device substrate, whereby the device characteristics of organic electroluminescence devices including an organic layer constituted by such a transfer layer can be improved.

Additional features and advantages are described herein, and will be apparent from the following Detailed Description and the figures.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

DETAILED DESCRIPTION

Transfer Sheet

Figure 1:
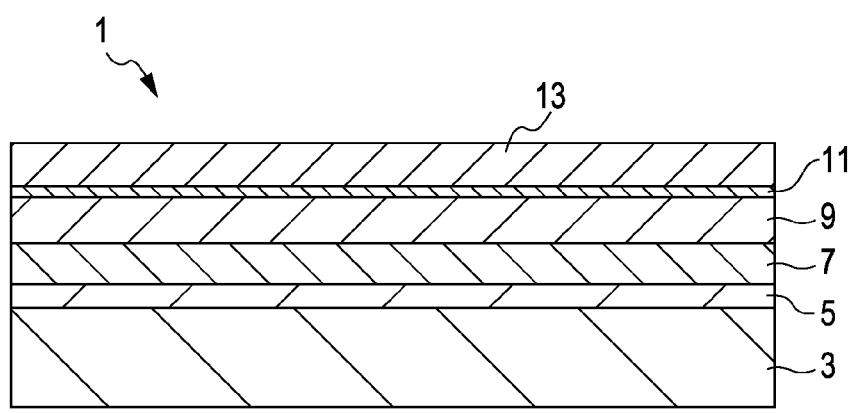
FIG. 1 is a schematic sectional view of a transfer sheet of an embodiment.

FIG. 1 is a schematic sectional view of a transfer sheet of an embodiment. As shown in FIG. 1, a transfer sheet 1 is formed by stacking an antireflection layer 5, a photothermal conversion layer 7, a metallic material layer 9, a passive layer 11, and a transfer layer 13 on a supporting substrate 3 in that sequence. Hereinafter, the details of the layers are described from the supporting substrate 3.

The supporting substrate 3 should be formed with a material that is sufficiently smooth and has optical transparency and thermal resistance to heat treatment. The supporting substrate 3 is composed of a glass substrate, a quartz substrate, a translucent ceramic substrate, or other substrates. A resin substrate may be used if there is no problem of dimensional control to heating temperature. In this case, for example, a glass substrate having a thickness of 0.1 to 3.0 mm is used as the supporting substrate 3.

The antireflection layer 5 is used for efficiently confining a laser beam Lv emitted from the supporting substrate 3 side in the photothermal conversion layer 7. For example, the antireflection layer 5 is composed of an amorphous silicon having a thickness of 40 nm. Such an antireflection layer 5 is formed on the supporting substrate 3 by chemical vapor deposition (CVD) or other methods.

The photothermal conversion layer 7 is preferably composed of a material having low reflectivity in a wavelength range of an energy ray (e.g., laser beam) used as a heat source in a thermal transfer step that uses this transfer sheet. For example, when a laser beam having a wavelength of about 800 nm emitted from a solid-state laser light source is used, chromium (Cr), molybdenum (Mo), or the like is preferred as a material having low reflectivity and a high melting point. In this case, for example, the photothermal conversion layer 7 composed of molybdenum having a thickness of 40 nm is used. Such a photothermal conversion layer 7 is formed on the antireflection layer 5 by sputtering or other methods.

The metallic material layer 9 is composed of a metal that forms passivity. It is preferably composed of a metal that reacts with either moisture or oxygen or both moisture and oxygen among the metals that form passivity. Examples of the metal include aluminum (Al), chromium (Cr), iron (Fe), and nickel (Ni), and at least one of them should be included. For instance, an alloy (AlNd) of aluminum (Al) and neodymium (Nd), a stainless steel composed of iron (Fe)-nickel (Ni)-chromium (Cr), or aluminum (Al) alone may be used. When AlNd is used, the metallic material layer 9 has improved heat resistance and good smoothness. In this case, for example, the metallic material layer 9 composed of aluminum having a thickness of 50 nm is used. Such a metallic material layer 9 is formed on the photothermal conversion layer 7 by sputtering or other methods.

The passive layer 11 is an oxide film formed on a surface of a metallic material. In this case, the passive layer 11 is an oxide film formed by oxidizing the surface of the metallic material layer 9. If the metallic material layer 9 composed of, for example, aluminum is used, the passive layer 11 composed of aluminum oxide ($Al_2O_3$) is formed on the surface of the metallic material layer 9. The passive layer 11 is a significantly stable layer, and is formed with a thickness of about 0.1 to 25 nm in accordance with the metallic material constituting the metallic material layer 9. Such a passive layer 11 is formed by, for example, oxidizing the surface of the metallic material layer 9.

If the photothermal conversion layer 7 is composed of a metal that forms passivity, the passive layer 11 may be directly formed on the surface of the photothermal conversion layer 7. In this case, the metallic material layer 9 is not necessarily disposed. However, if the metallic material layer 9 composed of a metal that reacts with either moisture or oxygen or both moisture and oxygen among the metals that form passivity is disposed, the metal that reacts with either moisture or oxygen or both moisture and oxygen is contained in the passive layer 11 formed on the surface of the metallic material layer 9. This produces an effect of removing hydrogen and oxygen on the surface of the passive layer 11.

The transfer layer 13 is a layer to be transferred in a transfer process that uses this transfer sheet and is composed of an organic material or the like. For example, in the case where a light-emitting layer of an organic electroluminescence device is formed using this transfer sheet, the transfer layer 13 is composed of an organic material constituting the light-emitting layer. Such a transfer layer 13 for forming a light-emitting layer is formed by, for example, simultaneously vaporizing 2-t-butyl-9,10-bis(2-naphtyl)anthracene (TBADN) and tetra-t-butyl-perylene (TBP) from separate vapor deposition boats under vacuum to codeposit them on the passive layer 11.

Transfer Method Using Transfer Sheet

Figure 2A:
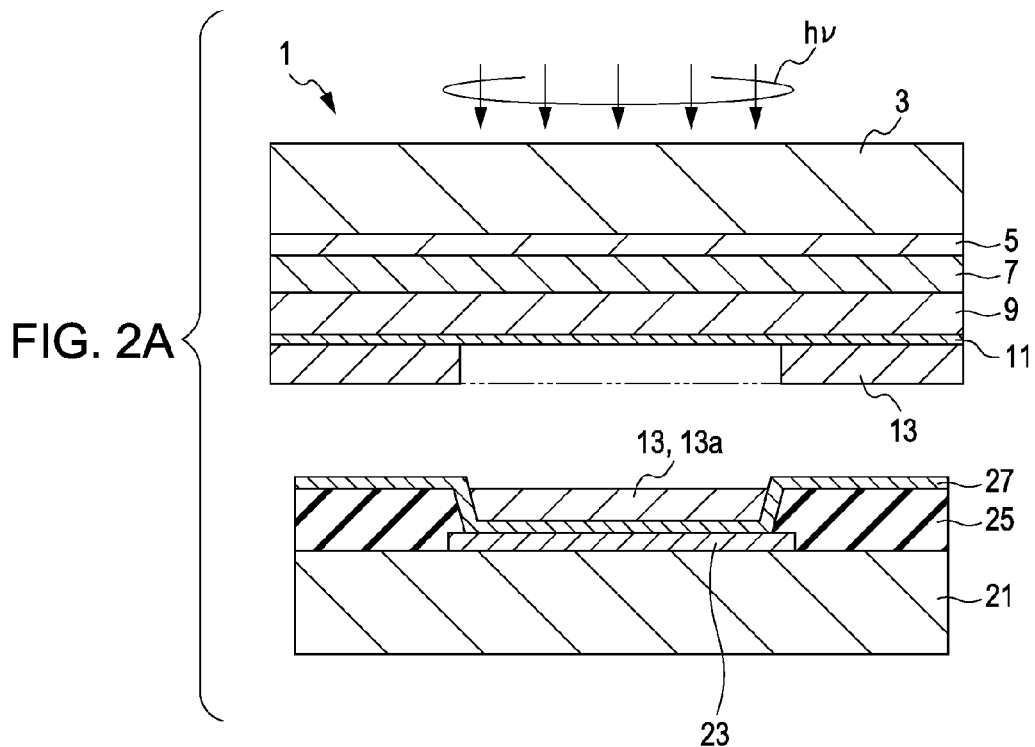
FIGS. 2A and 2B are sectional views showing formation steps of an organic electroluminescence device using the transfer sheet of the embodiment.
Figure 2B:
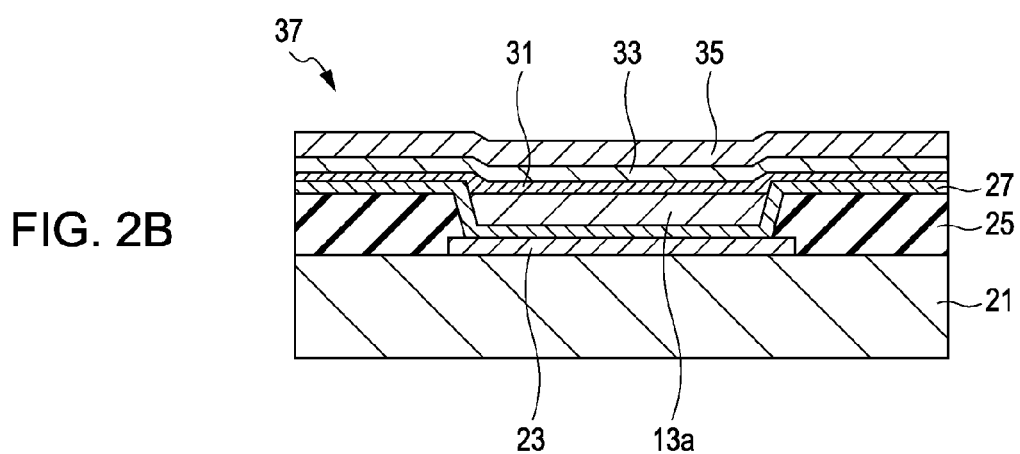

FIGS. 2A and 2B are sectional views showing formation steps of an organic electroluminescence device included in a method for manufacturing a display that uses the transfer sheet 1 described above. A procedure for forming an organic electroluminescence device will now be described with reference to FIGS. 2A and 2B.

As shown in FIG. 2A, a device substrate 21 as a target substrate is prepared first. The device substrate 21 is composed of, for example, a glass substrate, a silicon substrate, a plastic substrate, or a thin film transistor (TFT) substrate on which a TFT is formed.

A lower electrode 23 is patterned on the device substrate 21. The lower electrode 23 composed of, for example, a transparent conductive film is formed as an anode (or cathode) and patterned in a shape suitable for the driving system of the display manufactured herein.

The periphery of the lower electrode 23 is covered by an insulating film 25. A portion of the lower electrode 23 exposed from a window formed in the insulating film 25 is a pixel region on which an organic electroluminescence device is disposed. The insulating film 25 is composed of, for example, an organic insulating material such as polyimide and a photoresist or an inorganic insulating material such as silicon oxide.

For instance, a hole transporting layer 27 is disposed as a common layer that covers the lower electrode 23 and the insulating film 25. The hole transporting layer 27 composed of, for example, 4,4-bis[N-(1-naphthyl)-N-phenylamino]biphenyl (NPB) is formed with a thickness of 150 nm.

The transfer sheet 1 is disposed above the device substrate 21 on which layers are formed up to the hole transporting layer 27 as described above, so as to oppose the device substrate 21. In this case, the hole transporting layer 27 and the transfer layer 13 are opposed at a distance of about 1 μm and held under a reduced pressure (e.g., about $10^{-3}$ Pa).

In this state, a laser beam Lv having a wavelength of 800 nm is emitted from the supporting substrate 3 side of the transfer sheet 1. The laser beam Lv is selectively emitted to the region on the hole transporting layer 27 that corresponds to the region where a light-emitting layer is formed. The laser beam Lv is converted into heat in the photothermal conversion layer 7 of the transfer sheet 1. The transfer layer 13 is vaporized with the heat and transferred onto the hole transporting layer 27 of the device substrate 21. The transfer layer 13 that has been transferred to the device substrate 21 side is formed as a light-emitting layer 13a.

After that, as shown in FIG. 2B, an electron transporting layer 31 is formed so as to cover the entire surface of the device substrate 21 where the light-emitting layer 13a is formed. The electron transporting layer 31 is formed by vacuum depositing, for example, tris(8-hydroxyquinoline) aluminum (Alq3) with a thickness of 30 nm.

An electron injecting layer 33 is then formed on the electron transporting layer 31. The electron injecting layer 33 is formed by vacuum depositing, for example, lithium fluoride (LiF) with a thickness of 0.5 nm.

An upper electrode 35 is then formed on the electron injecting layer 33. The upper electrode 35 functions as a cathode when the lower electrode 23 is an anode, whereas functions as an anode when the lower electrode 23 is a cathode. In this case, the upper electrode 35 is formed as a cathode by vacuum depositing, for example, aluminum with a thickness of 100 nm.

As described above, an organic electroluminescence device 37 having a structure in which an organic layer including the light-emitting layer 13a is sandwiched by the lower electrode 23 and the upper electrode 35 is obtained.

An example of a method for manufacturing a display including the thus-formed organic electroluminescence device 37 includes a method disclosed in Japanese Unexamined Patent Application Publication No. 2007-173145, herein incorporated by reference.

Method for Forming Transfer Sheet

Figure 3:
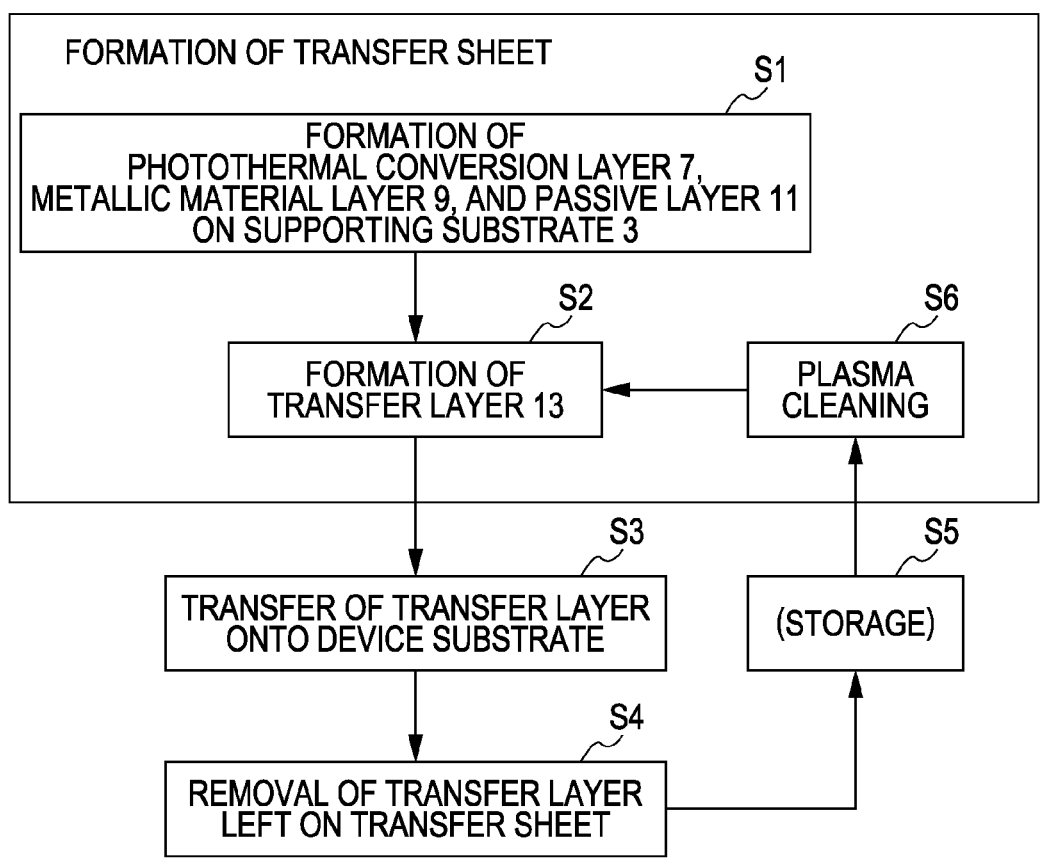
FIG. 3 is a flowchart showing a formation procedure of the transfer sheet, also in consideration of recycle use of the transfer sheet.

FIG. 3 is a flowchart showing a formation procedure of the transfer sheet used for the transfer described above, also in consideration of recycle use of the transfer sheet. The formation procedure including the recycle of the transfer sheet will now be described with reference to FIG. 1 on the basis of the flowchart of FIG. 3.

In step S1, the antireflection layer 5, the photothermal conversion layer 7, the metallic material layer 9, and the passive layer 11 are formed on the supporting substrate 3 in that sequence. The method for forming each of the layers is as described above. In particular, the passive layer 11 that is a feature structure is formed by oxidizing the surface of the metallic material layer 9 that forms passivity. In the case where the photothermal conversion layer 7 is composed of a metal that forms passivity, the passive layer 11 may be formed by oxidizing the surface of the photothermal conversion layer 7 without forming the metallic material layer 9.

In step S2, the transfer layer 13 composed of an organic material is formed on the passive layer 11. The formation of the transfer layer 13 in step S2 performed after step S1 is preferably conducted immediately after the formation of the passive layer 11. Up to this point, the transfer sheet 1 is formed.

In step S3, the transfer layer 13 is transferred onto the device substrate using the transfer sheet 1. This transfer step is conducted, for example, as described using FIG. 2A.

In step S4, a step of removing the transfer layer 13 left on the transfer sheet 1 without being transferred is conducted. In this case, the transfer layer 13 is removed by cleaning using, for example, a dilute hydrofluoric acid.

In step S5, the transfer sheet 1 in which the transfer layer 13 is removed is stored when necessary. The transfer sheet 1 can be stored in the atmosphere. This storing step is conducted when necessary. When transfer is conducted using the transfer sheet 1 immediately after step S4, the storing step may be omitted and step S6 may be directly conducted.

In step S6, plasma cleaning is conducted on the surface of the passive layer 11 of the transfer sheet 1, as a pretreatment for forming the next transfer layer. In this case, the cleaning is conducted with, for example, argon plasma.

Subsequently, the procedure returns to step S2, and the transfer layer 13 composed of an organic material is formed on the plasma-cleaned passive layer 11 to form the transfer sheet 1. After that, the steps after step S4 are repeatedly conducted. The plasma cleaning in step S6 and the formation of the transfer layer 13 in step S2 performed after step S6 are preferably conducted in succession without releasing the supporting substrate 3 in the atmosphere.

In the embodiment described above, since the passive layer 11 that is invariably stable in terms of material properties is used as a base and the transfer layer 13 is disposed thereon, the material properties of the transfer layer 13 can be maintained without being affected by the base. In other words, the surface of the passive layer 11 is not oxidized even if it is stored in the atmosphere, and the thickness and properties of the oxide film of the passive layer 11 are maintained constant.

Thus, even in the case where the transfer sheet 1 including up to the passive layer 11 is repeatedly used, the transfer layer 13 can be disposed on the passive layer 11 that is stable in terms of material properties, regardless of its storage conditions. As a result, even if the transfer layer 13 is composed of an organic material, the transfer layer 13 whose material properties are maintained without being affected by a base can be transferred onto the device substrate. This can also improve the device characteristics of the organic electroluminescence device having an organic layer constituted by the transfer layer 13.

Furthermore, since a robust manufacturing process that is independent of the storage conditions or the like can be realized as described above, the transfer sheet 1 including up to the passive layer 11 can be stored in the atmosphere. Therefore, there is no burden on a manufacturing apparatus and the manufacturing costs are reduced.

The evaluation results of the characteristics of the organic electroluminescence device manufactured by applying the embodiment described above will now be described. The organic electroluminescence device was manufactured in the procedure described using FIGS. 2A and 2B, with the transfer sheet 1 of this embodiment described using FIG. 1 (Example). In addition, another organic electroluminescence device was manufactured in the procedure described using FIGS. 2A and 2B, with the transfer sheet in which the passive layer 11 is not disposed in the structure of the transfer sheet 1 (Comparative Example). In Comparative Example, the transfer layer 13 composed of an organic material was formed immediately after the formation of the metallic material layer 9 under vacuum.

For the organic electroluminescence devices of Example and Comparative Example, the measurement results of the device characteristics such as luminous efficiency and half brightness life are shown in Table 1. In Table 1, the relative luminous efficiency and the relative half brightness life are shown when the measurement value in Comparative Example is 1.

TABLE 1

|  | Relative Luminous Efficiency | Relative Half Brightness Life |
|---|---|---|
| Example | 1.3 | 2.1 |
| Comparative Example | 1.0 | 1.0 |

As evident from Table 1, the values obtained from the organic electroluminescence device manufactured by applying the present application with the transfer sheet 1 in which the passive layer 11 is disposed are improved for both relative luminous efficiency and the relative half brightness life. Accordingly, it has been confirmed that transfer can be conducted while the material properties of a transfer layer are suitably maintained, by applying the present application.

It should be understood that various changes and modifications to the presently preferred embodiments described herein will be apparent to those skilled in the art. Such changes and modifications can be made without departing from the spirit and scope and without diminishing its intended advantages. It is therefore intended that such changes and modifications be covered by the appended claims.

The application is claimed as follows:

1. A transfer sheet comprising:
   a supporting substrate;
   a photothermal conversion layer disposed on the supporting substrate;
   a metallic material layer formed on the photothermal conversion layer;
   a passive layer disposed on the metallic material layer; and
   a transfer layer composed of an organic material, the transfer layer being disposed directly on a surface of the passive layer,
   wherein the passive layer is formed by oxidizing a surface of the metallic material layer including at least one of aluminum (Al), chromium (Cr), iron (Fe), and nickel (Ni), the metallic material layer being disposed on the photothermal conversion layer.

2. The transfer sheet according to claim 1,
   wherein the passive layer is an oxidized upper portion of the metallic material layer disposed on the photothermal conversion layer; and
   the metallic material layer is composed of a metal that forms passivity and reacts with either moisture or oxygen or both moisture and oxygen.

3. The transfer sheet according to claim 1, further comprising an antireflection layer formed between the supporting substrate and the photothermal conversion layer.

4. The transfer sheet according to claim 1, wherein the photothermal conversion layer includes chromium (Cr) or molybdenum (Mo).

5. The transfer sheet according to claim 1, wherein the metallic material layer includes an alloy selected from the group consisting of aluminum (Al) and neodymium (Nd), and a stainless steel composed of iron (Fe)-nickel (Ni)-chromium (Cr).

* * * * *